United States Patent [19]
Childers et al.

[11] Patent Number: 5,592,681
[45] Date of Patent: Jan. 7, 1997

[54] DATA PROCESSING WITH IMPROVED REGISTER BIT STRUCTURE

[75] Inventors: Jim D. Childers, Missouri City, Tex.; Paul J. Huelskamp, Minneapolis, Minn.

[73] Assignee: Texas Instruments Incorporated, Dallas, Tex.

[21] Appl. No.: 543,349

[22] Filed: Oct. 16, 1995

Related U.S. Application Data

[63] Continuation of Ser. No. 259,728, Jun. 14, 1994, abandoned.

[51] Int. Cl.$^6$ .................................................... G06F 13/00
[52] U.S. Cl. ........................ 395/800; 364/232.8; 364/260; 364/264; 364/DIG. 1
[58] Field of Search .............................. 395/800, DIG. 1, 395/825, 828, 840, 853, 882, 500, 182.03, 183.06; 307/465; 371/16.2, 21.7, 22.3, 23

[56] References Cited

U.S. PATENT DOCUMENTS

| | | | |
|---|---|---|---|
| 4,580,066 | 4/1986 | Berndt | 307/276 |
| 4,628,217 | 12/1986 | Berndt | 307/467 |
| 4,872,169 | 10/1989 | Whetsel, Jr. | 371/22.3 |
| 5,003,204 | 3/1991 | Cushing et al. | 307/465 |
| 5,084,874 | 1/1992 | Whetsel, Jr. | 371/22.3 |
| 5,150,366 | 9/1992 | Bardell, Jr. et al. | 371/22.3 |
| 5,172,011 | 12/1992 | Leuthold et al. | 307/272.2 |
| 5,231,312 | 7/1993 | Gongwer et al. | 307/465 |

*Primary Examiner*—Alpesh M. Shah
*Attorney, Agent, or Firm*—Scott B. Stahl; Leo N. Heiting; Richard L. Donaldson

[57] ABSTRACT

A data processing system (10) includes a register bit structure (27) which can be hard-wired (37, 39) but is also selectively configureable for read/write operation.

10 Claims, 2 Drawing Sheets

5,592,681

DATA PROCESSING WITH IMPROVED REGISTER BIT STRUCTURE

This application is a continuation of application Ser. No. 08/259,728, filed Jun. 14, 1994, now abandoned.

FIELD OF THE INVENTION

This invention relates generally to data processing and, more particularly, to data processing wherein hard-wired register bits are utilized.

BACKGROUND OF THE INVENTION

Data processing systems and data processors are used in myriad applications which in turn have an impact on virtually every aspect of life. The utility of these myriad applications can ordinarily be enhanced by improving the operational flexibility of the associated data processing systems and data processors.

Conventional data processing systems utilize registers for a variety of purposes, as is well known in the art. Conventionally, each register bit is either a read/write bit whose logic value can be selectively written over and thus changed, or a hard-wired bit whose logic value is fixed during manufacturing and cannot be changed later. The aforementioned absolute unchangeability of hard-wired register bits can be disadvantageous from emulation and testability standpoints.

It is therefore desirable to provide for the use of hard-wired register bits which do not have the aforementioned disadvantageous characteristic of absolute unchangeability.

The present invention provides the capability of selectively configuring a register bit as a hard-wired bit or a read/write bit.

DETAILED DESCRIPTION

Figure 1:
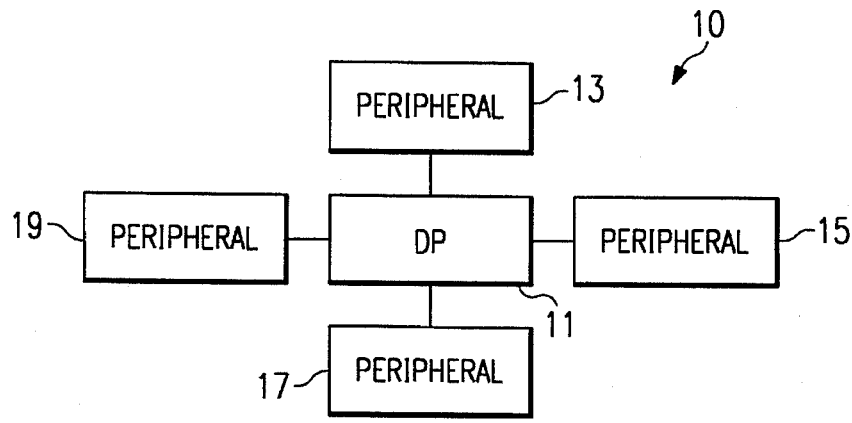
FIG. 1 is a block diagram of a data processing system according to the present invention.

FIG. 1 is a block diagram of a data processing system 10 according to the present invention. The data processing system 10 includes data processing circuitry 11 and peripheral circuitries 13, 15, 17 and 19. In the exemplary embodiment of FIG. 1, the data processing circuitry 11 is connected to each of the peripheral circuitries 13, 15, 17 and 19 for transfer of information between data processing circuitry 11 and peripheral circuitries 13, 15, 17 and 19. However, and as will be apparent from the following description, a data processing system according to the present invention could include any quantity and type of peripheral circuitries and peripheral devices (such as peripherals 13, 15, 17 and 19) interconnected among themselves and with data processing circuitry 11 in any manner heretofore or hereafter conceivable to workers in the art.

Figure 2:
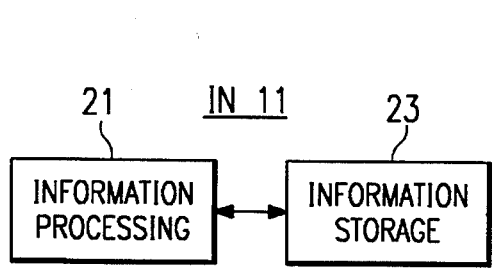
FIG. 2 is a block diagram illustrating the data processing device of FIG. 1 in greater detail.

FIG. 2 illustrates the data processing circuitry 11 of FIG. 1 in greater detail. The data processing circuitry 11 includes information processing circuitry 21 and information storage circuitry 23. In general, information processing circuitry 21 processes information while information storage circuitry 23 functions to hold or store information utilized by information processing circuitry 21 during operation thereof. For example, inputs to and outputs from the information processing operations of information processing circuitry 21 are stored in information storage circuitry 23.

Figure 3:
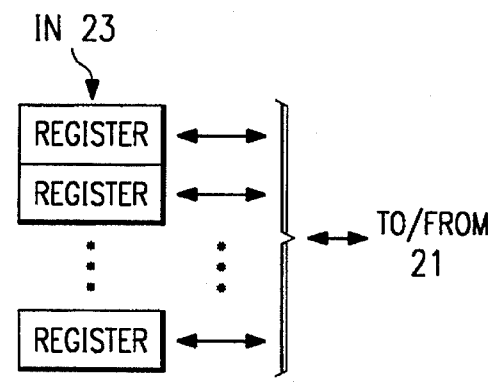
FIG. 3 illustrates a plurality of registers within the information storage circuitry of FIG. 2.

FIG. 3 illustrates in greater detail a portion of information storage circuitry 23. As shown in FIG. 3, information storage circuitry 23 includes a plurality of registers in which information is stored for use by information processing circuitry 21 during the information processing operations which it performs. As workers in the art are well aware, the uses of registers in data processing devices are many and varied.

Figure 4:
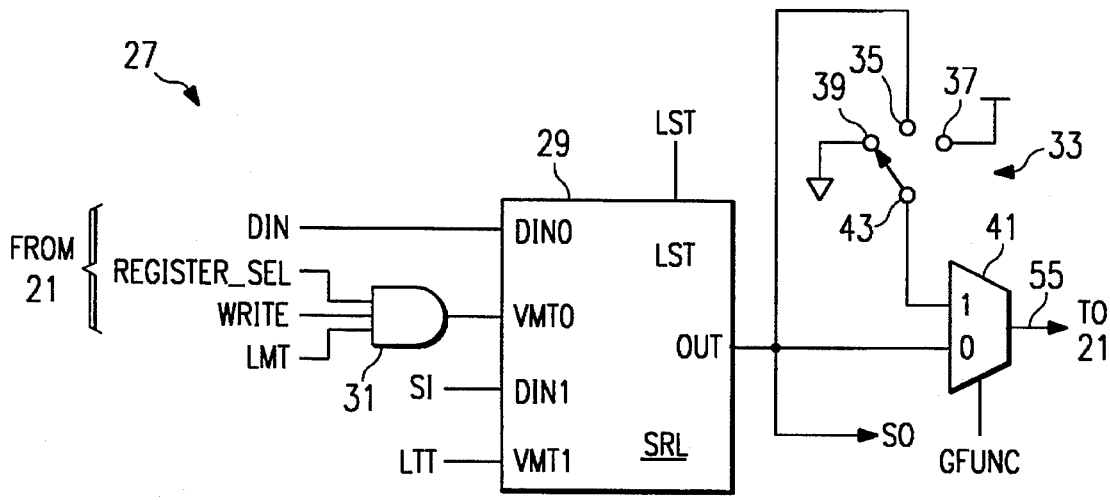
FIG. 4 diagrammatically illustrates a portion of a register of FIG. 3.

FIG. 4 illustrates one exemplary structure of a single register bit 27 within one of the registers of FIG. 3. Register bit structure 27 includes a master/slave type shift register latch (SRL) 29. The SRL 29 includes a first data input DIN0 for writing data and a second data input DIN1 for scanning data. VMT0 is the master clock input associated with DIN0, and VMT1 is the master clock input associated with DIN1. The slave clock input to SRL 29 is designated in FIG. 4 by LST. DIN0 of SRL 29 receives its input DIN from information processing circuitry 21, and the corresponding master clock VMT0 is driven by a three input AND gate 31. The inputs of AND gate 31 are a register select signal and a write signal from information processing circuitry 21, and a master clock signal LMT. The scan data input DIN1 of SRL 29 is part a serial scan path and is driven by signal SI produced upstream in the scan path. Master clock input VMT1 associated with scan input DIN1 is driven by scan master clock signal LTT.

Data that has been clocked into the master stage of SRL 29, namely data from either DIN0 (clocked in by VMT0) or DIN1 (clocked in by VMT1), is clocked though to the output of SRL 29 by slave clock LST.

As commonly practiced in the art, master clock signals LMT and LTT are identical in timing but are mutually exclusive (i.e. never pulsed simultaneously) to avoid data conflicts between inputs DIN0 and DIN1. Also as commonly practiced, slave clock LST must not overlap the master clocks LMT and LTT. That is, LST cannot pulse high until at least a few nanoseconds after LMT/LTT has pulsed low, and LST must pulse low at least a few nanoseconds before LMT/LTT pulses high.

When data is to be clocked into DIN0 in the exemplary embodiment of FIG. 4, the register select and write signals from information processing circuitry 21 must be high while master clock LMT is active, whereby master clock input VMT0 of SRL 29 is driven to latch the input data at DIN0 into the master stage of SRL 29. If scan data SI is to be input at DIN1, then the scan master clock LTT must be active to provide a clock signal at master clock input VMT1, whereby scan data at DIN1 is clocked into the master stage of the SRL 29. Master scan clock signal LTT is only active in test mode to scan data, and is disabled during functional operation. Master clock LMT is used for writing to the bit 27.

It should be clear from the foregoing discussion that a clock pulse at VMT0 followed by a clock pulse at LST constitutes a normal functional or write cycle wherein data from information processing circuitry 21 is stored at the output of SRL 29. A clock pulse at VMT1 followed by a clock pulse at LST constitutes a scan cycle wherein scan data input from the serial scan chain at SI is latched at the output of SRL 29. It should be noted that the output of SRL 29 is available in the scan path as designated at SO.

The data output of SRL 29 is also connected to one pole 35 of a triple pole single throw jumper 33. The jumper 33 can be programmed to one of its three mutually exclusively positions at a point late in the process of manufacturing the register bit structure 27. The other poles 37 and 39 of jumper 33 are respectively connected to power and ground. The switch 33 thus connects one of the poles 35, 37 and 39 to one input of a 2-to-1 multiplexer 41. The other input of multiplexer 41 is connected to the output of SRL 29. Multiplexer 41 functions as a switching element and is controlled by a signal designated as GFUNC. GFUNC is high during normal functional operation and is low during test/emulation operation. In the exemplary embodiment illustrated in FIG. 4, when GFUNC is high, the output 55 of register bit structure 27 will be hard-wired to a logic zero level via terminals 39 and 43 and multiplexer 41. However, during test/emulation operation, when GFUNC is low, the output 55 is connected via multiplexer 41 to the output of SRL 29. Thus, the register bit structure 27 shown in FIG. 4 provides a normal read/write register bit during test/emulation operation, while also providing a hard-wired bit during normal functional operation.

During the process of manufacturing the registers of the data processing device 11, an appropriate connection across switch 33 is made in order to provide the desired input to multiplexer 41. Thus, the register bit structure 27 is programmable during manufacture to select one of three optional configurations for normal functional operation, namely hard-wired logic zero 39, hard-wired logic 1 37, or read/write 35. The switch 33 can be implemented in several ways; some examples of which follow. Terminals 35 and 43 can be brought out to the edge of the bounding box of the module in which the register is located. That is, the terminals 35 and 43 would be located at the outer periphery of the module. Then, during top-level chip-route time, terminals 35 and 43 can be connected together (read/write operation) or terminal 43 can be connected to Vcc (hard-wired logic 1) or ground (hard-wired logic 0). As another example, the four terminals 35, 37, 39 and 43 can be made into a swap cell wherein terminal 43 is not connected to any of the other terminals, and then, after top-level routing but before pattern generation, this swap cell can be replaced by a cell having the same terminals but also including the desired connection between terminal 43 and one of terminals 35, 37 and 39. Another example is to use metal or contact-programmable points which can be programmed just before process completion.

If it is desired to use the register bit structure 27 for multiple bits in a register, then each such register bit structure can be identical to the exemplary structure of FIG. 4. However, noting that all bits of a single register are ordinarily written to at the same time, typically only one AND gate 31 will be required per register since all bits of the register would ordinarily utilize the same functional master clock VMT0.

Figure 5:
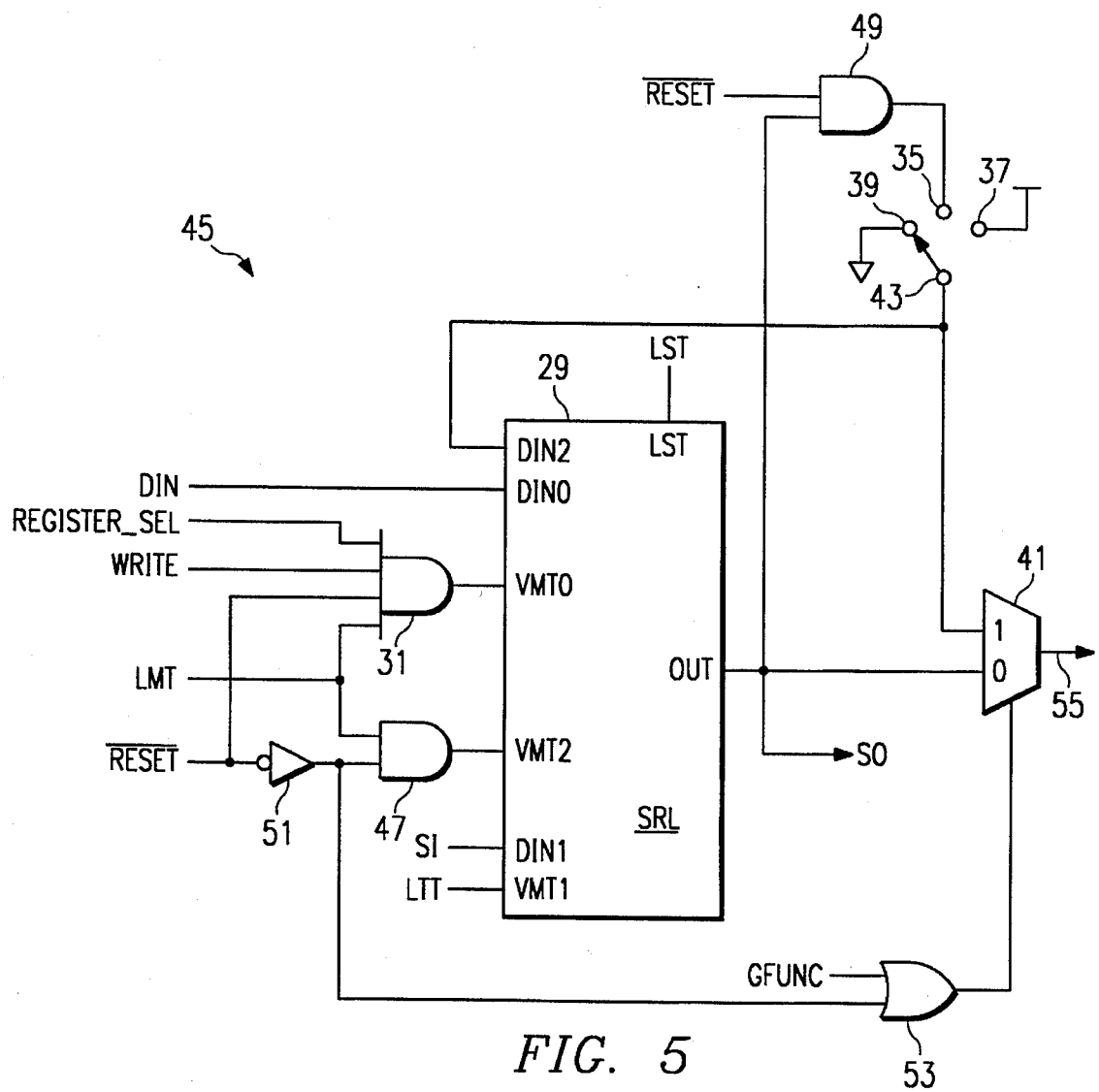
FIG. 5 diagrammatically illustrates a modification of the circuitry of FIG. 4.

FIG. 5 illustrates another exemplary register bit structure 45 which is similar to register bit structure 27 of FIG. 4, but also includes a reset feature. The reset feature is implemented using an active low reset signal along with additional AND gates 47 and 49, additional inverter 51, and additional OR gate 53. Features of FIG. 5 which correspond to those in FIG. 4 are numbered correspondingly in FIG. 5.

The SRL 29 of FIG. 5 has a third data input DIN2 and a corresponding master clock input VMT2. Data input DIN2 is connected to terminal 43, and clock input VMT2 is driven by the output of AND gate 47. Signal LMT is connected to one input of AND gate 47, and the other input of AND gate 47 is driven by inverter 51 whose input is the active low reset signal. The output of inverter 51 also drives one input of OR gate 53, whose other input is driven by GFUNC. The output of OR gate 53 is applied to the control input of multiplexer 41. The reset signal is input to AND gates 31 and 49. The other input of AND gate 49 is driven by the data output of SRL 29, and the output of AND gate 49 is connected to terminal 35.

As seen in FIG. 5, when the reset signal is inactive high, the data output of SRL 29 is passed through AND gate 49 directly to terminal 35 (as in FIG. 4), and AND gate 31 functions the same as in FIG. 4. Also, when the reset signal is inactive high, master clock VMT2 of SRL 29 is disabled via AND gate 47 and inverter 51, and the GFUNC signal controls multiplexer 41 (just as in FIG. 4) via the operation of inverter 51 and OR gate 53.

When the reset signal is active low, master clock input VMT0 is disabled via AND gate 31, and clock signal LMT is qualified at AND gate 47 for application to master clock input VMT2. Also, when the reset signal is active low, inverter 51 and OR gate 53 operate to select terminal 43 for output from multiplexer 41, and terminal 35 is taken low by operation of AND gate 49.

With the reset signal active low, an LMT clock pulse followed by an LST clock pulse causes the logic level at terminal 43 to be clocked through DIN2 to the data output of SRL 29. Thus, depending upon which of terminals 35, 37 and 39 is connected to terminal 43, the data output of SRL 29 will receive either the logic 0 imposed at terminal 35 by AND gate 49, or the hard-wired logic 1 at terminal 37, or the hard-wired logic 0 at terminal 39. As previously indicated, while reset is active low, the logic level at terminal 43 is also output from the register bit structure 45 via multiplexer 41. Thus, the reset feature of FIG. 5 permits the output of SRL 29 to be driven to a predetermined logic level before the output 55 of register bit structure 45 is connected to the output of SRL 29 via multiplexer 41.

If it is desired to apply the reset feature to each register bit in a given register, then each register bit structure within that register can be identical to the register bit structure 45 of FIG. 5, except that it may be possible to utilize only one each of inverter 51, AND gates 31 and 47, and OR gate 53, assuming that a single reset signal is to be used in conjunction with all of the register bits within the register, and further assuming, as above with respect to FIG. 4, that all register bits within the register will be written to together.

Figure 6:
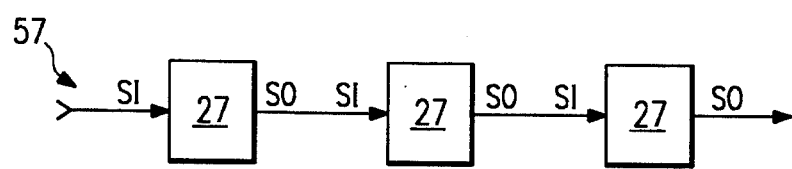
FIG. 6 illustrates a plurality of circuits according to FIG. 4, arranged in a serial scan path.

As previously indicated, the serial scan input SI and output SO of register bit structures 27 and 45 of FIGS. 4 and 5 are provided for connection into any serial scan path in the data processing device 11. For example, the scan input SI and the scan output SO of any given register bit structure can be respectively connected to the scan output of a second register bit structure and the scan input of a third register bit structure, with all three of the register bit structures being included within a single register of FIG. 3, or with any of the register bit structures being included within any of the registers of FIG. 3. FIG. 6 illustrates a plurality of register bit structures 27 connected in a serial scan path 57. More generally, the register bit structures shown in FIGS. 4 and 5 can be connected at any suitable point in any desired scan path within the data processing device 11.

It should be clear from the foregoing that each individual register bit of a given data processing system 10 can be programmed to a desired hard-wired logic value, but can still function as a read/write bit during testing or emulation. With the exemplary register bit structures of FIGS. 4 and 5, data processing devices become more general purpose in nature since even the hard-wired register bits can be programmed in test and emulation modes. This general purpose feature in some cases permits system testing, development and emulation to begin before the final design of a particular data processing device has been decided upon. For example, in the development of a given data processing system for which the final design of the data processor is undecided, it is possible to use an already existing data processor which includes register bit structures 27 but has been specifically designed for use in a completely different system, because any unwanted hard-wired registered bits in that existing data processor can be overridden for testing and emulation purposes.

Although exemplary embodiments of the present invention are described above, this does not limit the scope of the invention, which can be practiced in a variety of embodiments.

What is claimed is:

1. A data processing system, comprising:

data processing circuitry for performing data processing operations on data provided thereto;

a peripheral device connected to said data processing circuitry for communication with said data processing circuitry;

said data processing circuitry including a register for holding data therein, said register including a register bit structure having a data input and a data output, said register bit structure also including a latch having an input connected to said data input and having an output, said register bit structure including a terminal connected to said latch output, and said register bit structure also including a multiplexer having an output connected to said data output, said multiplexer having a plurality of inputs, one of said multiplexer inputs connected to said latch output, and another of said multiplexer inputs connected to said terminal; and wherein said multiplexer has a control input and connects said data output to said terminal when said control input indicates that said data processing circuitry is operating in a functional mode, and wherein said multiplexer connects said data output to said latch output when said control input indicates that said data processing circuitry is operating in an emulation mode or a test mode.

2. A data processing system, comprising:

data processing circuitry for performing data processing operations on data provided thereto;

a peripheral device connected to said data processing circuitry for communication with said data processing circuitry;

said data processing circuitry including a register for holding data therein, said register including a register bit structure having a data input and a data output, said register bit structure including a latch having an input connected to said data input and having an output, said register bit structure including a terminal connected to a fixed logic level, and said register bit structure including a multiplexer having an output and a plurality of inputs, said multiplexer output connected to said data output, one of said multiplexer inputs connected to said latch output, and another of said multiplexer inputs connected to said terminal; and wherein said multiplexer has a control input and connects said data output to said terminal when said control input indicates that said data processing circuitry is operating in a functional mode, and wherein said multiplexer connects said data output to said latch output when said control input indicates that said data processing circuitry is operating in an emulation mode or a test mode.

3. The system of claim 2, wherein said latch is a shift register latch having a further input for connection into a serial scan path.

4. The system of claim 3, wherein said further input of said shift register latch is coupled to said output of said shift register latch to permit data from said further input to be selectively latched at said output of said shift register latch.

5. A data processing system, comprising:

data processing circuitry for performing data processing operations on data provided thereto;

a peripheral device connected to said data processing circuitry for communication with said data processing circuitry;

said data processing circuitry including a register for holding data therein, said register including a register bit structure having a data input and a data output, said register bit structure including a latch having an input connected to said data input and having an output, said register bit structure including a terminal and a circuit for selectively gating said latch output to said terminal, and said register bit structure including a multiplexer having an output and a plurality of inputs, said multiplexer output connected to said data output, said latch output connected to one of said multiplexer inputs, and said terminal connected to another of said multiplexer inputs; and wherein said multiplexer has a control input and connects said data output to said terminal when said control input indicates that said data processing circuitry is operating in a functional mode, and wherein said multiplexer connects said data output to said latch output when said control input indicates that said data processing circuitry is operating in an emulation mode or a test mode.

6. An electronic device, comprising:

data processing circuitry for performing data processing operations on data provided thereto;

information storage circuitry for storing therein information used by said data processing circuitry, said information storage circuitry including a plurality of registers, one of said registers including a register bit structure having a data input and a data output, said register bit structure including a latch having an input connected to said data input and having an output, said register bit structure including a terminal connected to said latch output, and said register bit structure including a multiplexer having an output connected to said data output, said multiplexer having a plurality of inputs, one of said multiplexer inputs connected to said latch output, and another of said multiplexer inputs connected to said terminal; and wherein said multiplexer has a control input and connects and data output to said terminal when said control input indicates that said data processing circuitry is operating in a functional mode, and wherein said multiplexer connects said data output to said latch output when said control input indicates that said data processing circuitry is operating in an emulation mode or a test mode.

7. The device of claim 6, wherein said latch is a shift register latch having a further input for connection into a serial scan path.

8. The device of claim 7, wherein said further input of said shift register latch is coupled to said output of said shift register latch to permit data from said further input to be selectively latched at said output of said shift register latch.

9. An electronic device, comprising:

data processing circuitry for performing data processing operations on data provided thereto;

information storage circuitry for storing therein information used by said data processing circuitry, said information storage circuitry including a plurality of registers, one of said registers including a register bit structure having a data input and a data output, said register bit structure including a latch having an input connected to said data input and having an output, said register bit structure including a terminal connected to a fixed logic level, and said register bit structure including a multiplexer having an output and a plurality of inputs, said multiplexer output connected to said data output, one of said multiplexer inputs connected to said latch output, and another of said multiplexer inputs connected to said terminal; and wherein said multiplexer has a control input and connects said data output to said terminal when said control input indicates that said data processing circuitry is operating in a functional mode, and wherein said multiplexer connects said data output to said latch output when said control input indicates that said data processing circuitry is operating in an emulation mode or a test mode.

10. An electronic device, comprising:

data processing circuitry for performing data processing operations on data provided thereto;

information storage circuitry for storing therein information used by said data processing circuitry, said information storage circuitry including a plurality of registers, one of said registers including a register bit structure having a data input and a data output, said register bit structure including a latch having an input connected to said data input and having an output, said register bit structure including a terminal and a circuit for selectively gating said latch output to said terminal, and said register bit structure including a multiplexer having an output and a plurality of inputs, said multiplexer output connected to said data output, one of said multiplexer inputs connected to said latch output, and another of said multiplexer inputs connected to said terminal; and wherein said multiplexer has a control input and connects said data output to said terminal when said control input indicates that said data processing circuitry is operating in a functional mode, and wherein said multiplexer connects said data output to said latch output when said control input indicates that said data processing circuitry is operating in an emulation mode or a test mode.

\* \* \* \* \*